United States Patent [19]

Fey et al.

[11] Patent Number: 4,684,545

[45] Date of Patent: Aug. 4, 1987

[54] ELECTROLESS PLATING WITH BI-LEVEL CONTROL OF DISSOLVED OXYGEN

[75] Inventors: Edmond O. Fey, Vestal, N.Y.; Peter Haselbauer, Dettenhausen, Fed. Rep. of Germany; Dae Y. Jung, Endwell; Ronald A. Kaschak, Vestal, both of N.Y.; Hans-Dieter Kilthau, Rottenburg-Baisingen, Fed. Rep. of Germany; Roy H. Magnuson, Binghamton; Robert J. Wagner, Vestal, both of N.Y.

[73] Assignee: International Business Machines Corporation, Armonk, N.Y.

[21] Appl. No.: 827,427

[22] Filed: Feb. 10, 1986

[51] Int. Cl.⁴ .............................................. C23C 18/40
[52] U.S. Cl. ...................................... 427/98; 427/345; 427/443.1; 106/1.23
[58] Field of Search ...................... 427/345, 98, 443.1; 106/1.23

[56] References Cited

U.S. PATENT DOCUMENTS

| | | | |
|---|---|---|---|
| 4,152,467 | 5/1979 | Alpaugh | 427/345 |
| 4,162,217 | 7/1979 | Herrmann | 427/345 |
| 4,525,390 | 1/1985 | Alpaugh | 427/443.1 |
| 4,534,797 | 8/1985 | King | 106/1.23 |
| 4,554,184 | 11/1985 | Canestaro | 427/345 |
| 4,565,575 | 1/1986 | Cardin | 427/443.1 |

Primary Examiner—John D. Smith
Attorney, Agent, or Firm—Manny W. Schecter; E. W. Galbi; M. H. Klitzman

[57] ABSTRACT

Nodule formation in a continuous electroless copper plating system is minimized by independently controlling the dissolved oxygen contents on the plating solution in the bath and in the associated external piping. The level of dissolved oxygen in the plating tank is maintained at a value such that satisfactory plating takes place. At the point where the plating solution leaves the tank, additional oxygen gas is introduced into the solution so that the level of dissolved oxygen in the plating solution in the external piping is high enough to prevent any plating from taking place in the external piping and so that in the external piping the copper is etched or dissolved back into solution. At the end of the external piping, the dissolved oxygen level is reduced so that the dissolved oxygen level of the plating solution in the tank is maintained at the level where plating will take place.

8 Claims, 1 Drawing Figure

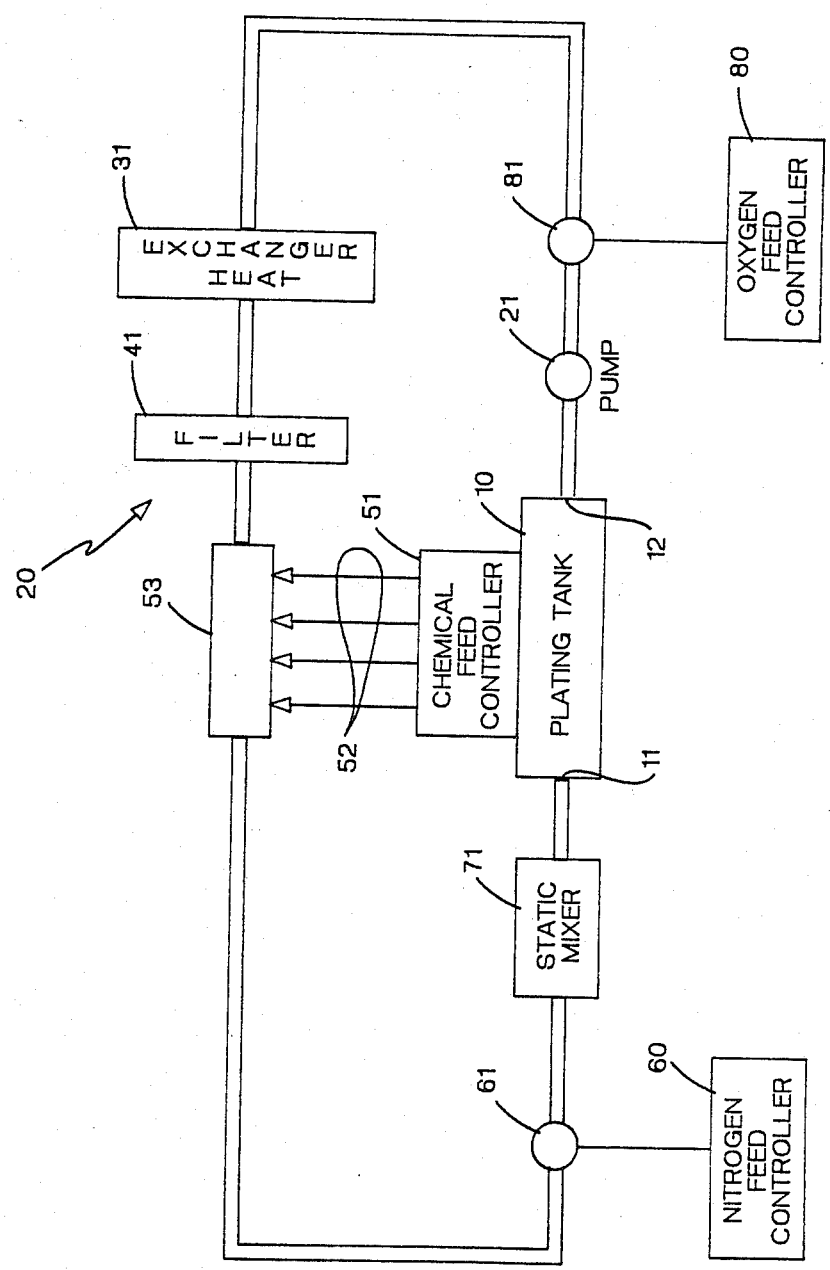

ELECTROLESS PLATING WITH BI-LEVEL CONTROL OF DISSOLVED OXYGEN

TECHNICAL FIELD

The present invention relates to manufacturing printed circuit boards. More particularly, this invention relates to an improved process and system for electrolessly depositing copper on printed circuit boards. It is noted that what is herein referred to as electroless plating is sometimes called additive plating.

BACKGROUND AND PRIOR ART

The technology for electroless copper plating on electrical printed circuit boards is well known and well developed. It is known that proper control of the oxygen content of the plating bath is essential to the plating process. It is also known that if the oxygen content of the bath is not properly controlled, nodules of extraneous copper will be formed on the circuit board. These copper nodules can cause defects in the circuit board.

It is known that oxygen influences the plating ability of an electroless plating bath. For example, U.S. Pat. No. 4,152,467 (Alpaugh) entitled "Electroless Copper Plating Process with Dissolved Oxygen Maintained in Bath" discusses control of the oxygen content of an additive plating bath using air for oxygen control. U.S. Pat. No. 4,152,467 (Alpaugh) also contains a discussion of prior art references concerning the effect of oxygen and other gases on an electroless plating process. The discussion of the prior art references in U.S. Pat. No. 4,152,467 (Alpaugh) is hereby incorporated by reference. Also for a discussion of the effect of oxygen on a plating process see the discussion of skip plating in U.S. Pat. No. 3,900,599 (Feldstein) wherein it is suggested that skip plating can be eliminated by removing oxygen from the plating bath prior to the plating operation. It is noted that the electroless plating bath described in U.S. Pat. No. 3,900,599 (Feldstein) is a flash or strike electroless bath and subsequent electrodeposition is contemplated (see column 1, lines 65 et seq). This reference is cited here merely to show that it is known that the presence of oxygen in an electroless bath influences the plating ability of the bath.

Other references such as U.S. Pat. No. 3,666,527 (Feldstein) and U.S. Pat. No. 3,454,416 (Heymann) teach or suggest that oxygen should not deliberately or purposely be introduced in a system for electrolessly plating copper. The stabilizing effect of oxygen is described in references such U.S. Pat. No. 2,938,805 (Agens).

The use of nitrogen in an electroless plating bath is also described in the prior art. For example, U.S. Pat. No. 2,938,805 (Agens) suggests aerating a copper electroless plating bath by employing an oxygen-containing gas which is diluted with an inert gas such as nitrogen. It is however noted that the Agens patent suggests that no advantage would be obtained by using a gas containing less than about 20% oxygen in air (see column 3, lines 63–67). Other references such as U.S. Pat. No. 3,300,335 (Horvath) suggests employing a gas which can be air or an inert gas such as nitrogen in an electroless plating bath. Other references such as, for example, an article published in the IBM Technical Disclosure Bulletin Vol. 27, No. 1B, page 24 entitled "Method of Reducing the Formation of Copper Nodules in an Additive Plating Bath" by U. Schuster also suggests that air can be used to prevent the formation of nodules.

Discussions of the effect of oxygen in a nickel plating system can be found, for instance, in Chemical Abstracts, Volume 76, page 62385g and Chemical Abstracts, Volume 72, page 92799e. In particular see U.S. Pat. No. 4,550,036 (Ludwig). The use of gases such as hydrogen, helium, methane, or neon in electroless nickel plating is discussed in U.S. Pat. No. 2,819,188 (Metheny).

It is known that in continuously operating electroless plating systems, one must continuously replenish the chemicals in the plating solution and one must also continuously remove impurities from the plating solution. Systems for continuously plating generally include a plating tank and external piping. The external piping is used to remove plating solution from the tank, treat the solution, and return the treated solution to the tank. The plating solution that is removed from the tank is filtered to remove small copper particles and other impurities from the solution. As these filters remove copper particles from the solution, they become clogged and they must be replaced.

Furthermore, particles trapped on the filters act as nucleating sites for additional plating and these particles continue to grow. One result of the plating that takes place on the filters is that the filters have to be replaced at relatively short intervals. In conventional electroless plating systems, plating not only takes place on particles trapped by the filters, but plating takes place on the pipes and on all other surfaces. The plating that takes place in the external piping (including the filters) is not only wasteful, but it also harms the system and the system must be regularly stopped and the extraneous copper removed.

The extraneous plating that takes place in the external piping of prior art systems has another deleterious effect. Such plating forms small particles of copper in the plating solution. These small particles flow into the plating tank and act as nucleating sites for nodules on the circuit board that is being plated. These nodules cause defective circuit boards.

OBJECTS OF THE PRESENT INVENTION

The object of the present invention is to provide an improved electroless plating process and system.

Another object of this invention is to provide an electroless plating process and system which will minimize or eliminate the formation of extraneous copper nodules on the printed circuit boards that are being plated.

Another object of the present invention is to reduce or eliminate plating in the external piping of an electroless plating system.

Another object of this invention is to provide a plating system and method which will be able to operate for longer periods of time without having to be shut down to etch away copper which has plated in the external piping of the system.

Still another object of the present invention is to provide a plating system and method which will plate printed circuit boards that have less defects caused by copper nodules.

Yet another object of this invention is to provide a plating system and method that utilizes less plating chemicals as a result of less extraneous plating.

SUMMARY OF THE INVENTION

The present invention significantly improves the performance of a continuously operating additive plating system by eliminating or reducing the formation of extraneous copper nodules during the plating operation. This is done by maintaining one level of oxygen in the plating tank and maintaining a significantly higher level of oxygen in the external piping.

The oxygen level in the tank is maintained at the optimum level which provides proper plating. At the beginning of the external piping, oxygen gas is introduced into the plating solution to increase its dissolved oxygen level so that the solution is in effect turned into an etching solution. That is, copper goes into solution rather than coming out of solution. At the end of the external piping the oxygen level is reduced to a level consistent with the oxygen level desired in the plating bath.

Utilizing the present invention, any copper in the external piping is in effect etched or dissolved back into solution due to the high level of oxygen. This eliminates or at least minimizes plating from taking place in the external piping and it further eliminates or minimizes minute copper particles from flowing into the plating tank from the external piping. It is noted that minute particles can act as nucleating sites for unwanted nodules.

DESCRIPTION OF THE DRAWINGS

The sole FIGURE schematically shows a plating tank and the associated external piping.

DETAILED DESCRIPTION OF THE INVENTION

Apparatus that can be operated in accordance with the present invention is shown schematically in the sole FIGURE in this application. The system consists of a conventional plating tank 10 and associated external piping which is generally designated 20. The plating tank 10 has an input port 11 for supplying plating solution, an output port 12 for discharging plating solution and a chemical feed controller 51. A pump 21 pumps the plating solution from port 12 through a heat exchanger 31, a filter 41 and a static mixer 71. Chemical feed controller 51 senses the concentration of various chemicals in tank 10 and introduces chemicals into the plating solution at point 53 to maintain each of the chemicals at the desired level. An oxygen feed controller 80 introduces oxygen into the plating solution at point 81 and a nitrogen feed controller introduces nitrogen into the plating solution at point 61.

All of the components shown in the FIGURE are commercially available components. Likewise, the piping that interconnects these components is the standard type of piping that is found in commercial units of this type. Therefore, both the components and the piping are shown diagrammatically in the FIGURE. The actual structure of tank 10 or of the other components shown in the FIGURE forms no part of this invention. They are commercial units and they are, therefore, not described in detail herein.

The plating tank 10 is filled with plating solution and it operates in a normal fashion. The plating solution includes:

(a) cupric sulfate
(b) sodium salt of EDTA
(c) sodium hydroxide
(d) sodium cyanide
(e) formaldehyde
(f) surfactant
(g) chelator such as Quadrol
(h) water The preferred percentages of these ingredients to obtain satisfactory plating are known and disclosed in the literature. The specific composition of the plating bath in the plating tank 10 is not a part of this invention. Chemical feed controller 51 can be set to maintain the composition of the plating solution in plating tank 10 at the operating points which produce the desired plating action as specified by the prior art.

It is also known that other parameters such as temperature and oxygen level of the plating solution in tank 10 must be controlled to desired levels in order to get satisfactory plating. These operating points can be maintained at the levels specified by the prior art such as those disclosed in U.S. Pat. No. 3,095,309 (Zeblisky), U.S. Pat. No. 4,152,467 (Alpaugh), U.S. Pat. No. 4,448,804 (Amelio), or in abandoned application Ser. No. 816,082 (Burnett). With respect to the present invention it is merely necessary that the level of various chemicals and the oxygen content of the plating solution in tank 10 be maintained at an operating point such that satisfactory plating will take place.

As shown herein, there is no separate air supply into tank 10. It is noted that some prior art references such as U.S. Pat. No. 4,152,467 (Alpaugh) show a separate means for introducing air into plating tank 10 in order to maintain the oxygen level at the desired operating point. With the system shown here the desired operating point for the oxygen in tank 10 is maintained by balancing oxygen feed controller 80 and nitrogen feed controller 60 in a manner hereinafter described. Alternate means for maintaining the oxygen level in tank 10 at the desired level could be employed such as a separate air supply into plating tank 10. The specific means for maintaining the oxygen level in tank 10 at the desired operating point forms no part of the present invention.

The present invention can be used to coat both surfaces of a printed circuit board substrate as well as to plate copper in the plated through holes or vias and/or blind holes in a substrate.

Prior to plating a substrate with copper utilizing the present invention, the holes in the circuit board are made and suitably cleaned and preconditioned in a conventional manner. The particular cleaning and preconditioning steps used form no part of this invention and these steps can be carried out as taught by the prior art.

For instance, the preparation of the surface can include preconditioning by physical means such as sand and/or vapor blasting and/or chemical methods such as solvent swelling. A typical solvent is N-methyl pyrrolidone. The substrate can also be pretreated with a sulfuric/chromic acid composition.

Among the more widely employed procedures for catalyzing or seeding a substrate is the use of a stannous chloride sensitizing solution and a palladium chloride activator to form a layer of metallic palladium particles. For instance, one method for catalyzing a dielectric substrate is exemplified by U.S. Pat. No. 3,011,920 (Shipley) which includes sensitizing the substrate by treating it with a solution of colloidal metal, accelerating the treatment with a selective solvent to remove protective colloids for the sensitized dielectric substrate, and then electrolessly depositing the copper onto the sensitized substrate.

Also, as suggested, for example, in U.S. Pat. No. 3,099,608 (Radovsky) a dielectric substrate can be pretreated by depositing a thin film of "conductive" type of metal particle such as palladium metal from a semicollodial solution onto the dielectric substrate to provide a conducting base which permits electroplating with a conductive metal on the "conductive" base. It is noted that U.S. Pat. No. 3,632,388 (Grunwald) suggests a method for treating a polymeric plastic substrate in a plating process which utilizes a preliminary chromic acid etch followed by a one-step activation in a tin-palladium hydrosol.

Alternatively, one could use the "triple seeding" technique disclosed in U.S. Pat. No. 4,066,809 (Alpaugh). This technique includes contacting the surfaces of the dielectric substrate first with a stannous chloride sensitizing solution, then with a palladium chloride activator, and then with a palladium chloride/stannous chloride/hydrochloric acid seeder bath.

Prior to the stannous-chloride and palladium-chloride treatment, the substrate can be treated with an aqueous solution containing a multifunctional ionic polymer, as disclosed in U.S. Pat. No. 4,478,885 (Kuramoto). Alternatively, prior to the stannous-chloride and palladium-chloride treatment, the substrate can be treated with an aqueous solution containing multifunctional ionic polymer, as disclosed in U.S. Pat. No. 4,478,883 (Bupp) or in U.S. patent application Ser. No. 696,879 (Bupp), the disclosures of which are incorporated herein by reference.

The specific composition of the plating bath, the seeding and other pre-treatments used form no part of the present invention and these can be done as taught by the prior art.

The external piping which is generally designated 20 begins at the point designated output port 12 on the attached drawing. Output port 12 designates and represents the point where plating solution is obtained from tank 10. This is shown schematically in the attached FIGURE. As is well known, the plating tank 10 would be provided with an overflow weir. The plating solution would flow over this weir into a sump from which it would be pumped into the external piping.

While the specific operating point for plating in the tank constitutes no part of this invention, it is for example noted that as described in the previously cited references, satisfactory plating will take place if the bath is maintained at an operating point of 73 degrees centigrade and an oxygen content is in the range of 2.0 to 3.5 ppm. With respect to the present invention one merely need maintain an operating point in bath 10 at which satisfactory plating takes place.

The oxygen feed controller 80 introduces enough oxygen in the system to raise the oxygen level in the external piping to a level above the level at which plating will take place. For example, if the system is operating at 73 degrees centigrade, the oxygen feed controller 80 would supply sufficient oxygen to increase the oxygen level above 3.5 ppm. As the oxygen level is increased the rate at which plating (copper reduction) occurs is significantly reduced. For example, at an operating point such as that described above, i.e. a temperature of 73 degrees centigrade and reagent concentrations such as those describes in U.S. Pat. No. 4,152,467 (Alpaugh) or in U.S. Pat. No. 4,525,390 (Alpaugh), when the oxygen level is in the range of 3.5 to 20 ppm no significant amount of copper reduction takes place and copper is in fact dissolved or etched into the plating solution.

After the plating fluid passes through heat exchanger 31 (which is set to maintain the desired operating temperature) and filter 41, nitrogen is introduced into the plating fluid by nitrogen feed controller 60. Enough nitrogen is introduced to force oxygen out of solution until the oxygen content of the solution is back to within the range where plating will take place.

The nitrogen supplied by nitrogen feed controller 60 helps to agitate the plating fluid in bath 10. Hence, it is desirable to maintain the rate of supply of nitrogen at a relatively stable rate such as between 1.5 to 2.5 scfm. If this technique is chosen, one would set the nitrogen feed controller 60 to the desired level and then adjust oxygen feed controller 80 so that it provides sufficient oxygen so that bath 10 would have the desired oxygen content. The net result of such balancing would be that bath 10 would have a level of oxygen that would allow plating, whereas, there would be a higher level of oxygen in the external piping and plating in the external piping would be inhibited.

In summary, the settings of oxygen feed controller 80 and nitrogen feed controller 60 are balanced so that oxygen feed controller 80 introduces enough oxygen into the system so that the oxygen level in the plating solution in the external pipes is above the value at which plating will take place and the nitrogen feed controller 60 introduces enough nitrogen into the plating solution such that enough oxygen is displaced so that the oxygen level of the plating solution being returned to tank 10 is in the range where plating takes place. One way of doing this is to set one of the controllers to a desired point and then to adjust the other controller as needed.

In one alternate embodiment of this invention air rather than nitrogen is introduced at point 61. The air has the same effect as the nitrogen, that is, the level of oxygen in the plating solution is reduced to a level where plating can take place. In this alternate embodiment bath 10 is operated at 73 degrees Centigrade, and 20 liters per hour of oxygen is injected by oxygen feed controller 80.

At point 61 in the external piping 1000 liters per hour of air is introduced into the plating solution. The introduction of air causes oxygen to come out of solution, thereby reducing the oxygen level so that plating can take place. The introduction of 1000 liters per hour of air at point 61 was found to reduce the level of oxygen sufficiently so that satisfactory plating could take place in tank 10. In this system the external piping is maintained at a nominal pressure of 1.5 bar, tank 10 contained 1600 gallons (that is, 6000 liters) of plating solution and 270 gallons (that is, 1000 liters) per minute of plating solution was circulated in the external piping.

It should be noted that various other alternative embodiments of this invention are possible. For example, one could have a second tank connected in the external piping loop, and the oxygen level in this tank could be maintained at a higher level than the oxygen content in the plating tank so that any small particles of copper in the plating solution would be dissolved as they pass through this second tank. Alternatively, the change in level of the oxygen could be in a time domain rather than in a space domain as described herein. That is, there could be a plating cycle during which the oxygen is maintained at a level that facilitates plating followed by an etch cycle where the level of oxygen is raised so that no plating takes place and nodules are dissolved back into solution.

While the present invention has been described in connection with particular applications and embodiments thereof, additional applications, embodiments, and modifications will occur to those skilled in the art and such additional applications, embodiments, and modifications are included within the spirit and scope of this invention and the following claims.

We claim:

1. A method of minimizing the nodules produced by a continuous electroless copper plating system which has a plating solution in a plating tank and in external piping and wherein the oxygen level in the plating tank is maintained at a first value such that plating takes place comprising the steps of:

adding oxygen at the point the plating solution enters the external piping so that no plating takes place in the external piping;

adjusting the oxygen value in the plating solution to said first value prior to the point the plating solution goes from said external piping to said plating tank; and recirculating the plating solution between said plating tank and said external piping.

2. The method recited in claim 1 wherein the oxygen value of said plating solution is adjusted prior to the point the plating solution goes from said external piping to said plating tank by the introduction of nitrogen.

3. The method of claim 1 wherein oxygen is added at the point the plating solution enters the external piping so that etching of said nodules takes place in the external piping.

4. A continuous electroless plating process for minimizing nodule formation comprising the steps of:

maintaining the oxygen level in a plating bath at a first value such that plating takes plate in said bath; and maintaining the oxygen level at a substantially higher than said first value in external piping connected to said bath such that etching of said nodules takes place in said external piping.

5. The process of claim 4 additionally comprising the step of recirculating solution between said plating bath and said external piping.

6. A method fo eletrolessly plating circuit lines on printed circuit boards in a plating bath that has associated external piping comprising the steps of:

placing said circuit boards in said plating bath;

maintaining the oxygen level in said plating bath at an operating point such that copper is deposited on said circuit boards; and maintaining the oxygen level in said external piping at a level such that copper is etched into the solution in said external piping.

7. A method of minimizing the nodules produced by an electroless copper plating system which has a plating solution in a plating tank and in external piping and wherein the oxygen level in the plating tank is maintained at a first value such that plating takes place comprising the steps of:

adding oxygen at the point the plating solution enters the external piping so that no plating takes place in the external piping;

injecting air into said plating solution prior to the point said plating solution goes from said external piping to said plating tank to adjust the oxygen value in the plating solution to said first value; and recirculating the plating solution between said plating tank and said external piping.

8. The method of claim 7 wherein oxygen is added at the point the plating solution enters the external piping so that etching of said nodules takes place in the external piping.

* * * * *